US011175319B1

(12) United States Patent
Guedon et al.

(10) Patent No.: US 11,175,319 B1
(45) Date of Patent: Nov. 16, 2021

(54) HIGH ACCURACY LOW TEMPERATURE DRIFT HIGH-SIDE CURRENT SENSING HARDWARE AND METHOD

(71) Applicant: STMicroelectronics Asia Pacific Pte Ltd, Singapore (SG)

(72) Inventors: Yannick Guedon, Singapore (SG); Baris Volkan Yildirim, Singapore (SG); Teerasak Lee, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 0 days.

(21) Appl. No.: 17/025,210

(22) Filed: Sep. 18, 2020

(51) Int. Cl.
*G01R 19/25* (2006.01)
*H02J 50/12* (2016.01)

(52) U.S. Cl.
CPC .......... *G01R 19/2506* (2013.01); *H02J 50/12* (2016.02)

(58) Field of Classification Search
None
See application file for complete search history.

(56) References Cited

U.S. PATENT DOCUMENTS

| 7,550,954 | B2 * | 6/2009 | De Nisi | H02M 3/07 323/266 |
| 2003/0062964 | A1 * | 4/2003 | Guedon | H03K 5/26 332/109 |
| 2004/0012411 | A1 * | 1/2004 | Guedon | H03K 17/102 326/86 |
| 2017/0054333 | A1 | 2/2017 | Roehrl et al. | |
| 2019/0109739 | A1 | 4/2019 | Oettinger | |
| 2019/0148987 | A1 | 5/2019 | Jung | |
| 2019/0181697 | A1 | 6/2019 | Malkin et al. | |
| 2019/0190319 | A1 | 6/2019 | Kawamae et al. | |
| 2019/0222073 | A1 | 7/2019 | Lee et al. | |
| 2020/0366121 | A1 * | 11/2020 | Guedon | H02J 50/12 |
| 2021/0088567 | A1 * | 3/2021 | Guedon | H02J 50/80 |
| 2021/0091598 | A1 * | 3/2021 | Ng | H02M 1/36 |
| 2021/0135912 | A1 * | 5/2021 | Guedon | H02J 50/12 |

FOREIGN PATENT DOCUMENTS

| CN | 108879982 A | 11/2018 |
| CN | 110040013 A | 7/2019 |

\* cited by examiner

*Primary Examiner* — Lincoln D Donovan
*Assistant Examiner* — Khareem E Almo
(74) *Attorney, Agent, or Firm* — Crowe & Dunlevy

(57) ABSTRACT

A wireless-power-transmission-system includes a bridge with a tank-capacitor coupled thereto, a sense-resistor coupled between the bridge and an input of a regulator, a switching-circuit having first and second inputs coupled across the sense-resistor, and a gain-stage having first and second inputs capacitively coupled to first and second outputs of the switching-circuit. An ADC digitizes output of the gain-stage by comparing the output to a reference voltage, and a temperature-independent current source is coupled to a reference-resistor to generate the reference voltage. In a reset-phase, the switching-circuit shorts the inputs of the gain-stage to one another, and the gain-stage shorts its inputs to its output. The switching-circuit, in a first-chopping-phase, couples the sense-resistor between the first and second inputs of the gain-stage, and in a second-chopping-phase, couples the sense-resistor in reverse between the second and first inputs of the gain-stage. The resistance of the reference-resistor tracks the sense-resistor across temperature.

28 Claims, 13 Drawing Sheets

| ADC | Filter | Worst-case Error [dB] | Resolution [mA] |
|---|---|---|---|
| 9 | 7 | -45 | 14.05853313 |
| 9 | 9 | -48 | 9.952679264 |
| 9 | 12 | -49.2 | 8.668421261 |
| 10 | 9 | -53.2 | 5.46940406 |
| 12 | 9 | -62.7 | 1.832061333 | ced
HIGH ACCURACY LOW TEMPERATURE DRIFT HIGH-SIDE CURRENT SENSING HARDWARE AND METHOD

TECHNICAL FIELD

This disclosure is directed to the field of wireless power transmission and, in particular, to hardware, operating techniques for the hardware, and methods for sensing power wirelessly received or transmitted via wireless power transmission.

BACKGROUND

Portable electronic devices, such as smartphones, smartwatches, audio output devices (earbuds, headphones), and wearables operate on battery power, and not from wired power transmitted thereto over wired transmission lines and distribution systems. The batteries used for such devices are typically rechargeable and, therefore, a way to recharge the power of such batteries is necessary.

Most portable electronic devices include a charging port, typically conforming to the Micro USB or USB-C standards, into which a power cord connected to a power source can be inserted to provide for recharging of their batteries. However, such charging ports may make it difficult to enhance the water resistance of the electronic device, and are subject to damage from repeated use. In addition, some smaller portable electronic devices (for example, earbuds and smartwatches) may lack the available space to provide for a charging port. Still further, some users may find it cumbersome to plug a power cord into the charging port of an electronic device to charge the battery of that device.

Therefore, to address these issues, wireless power transmission has been developed. As shown in FIG. 1, a typical prior art wireless power transmission system 10 utilizes a transmitter 11 including a transmission coil Lp and a serial capacitance Cp forming a serial resonant LC network, driven by electric power from a power source 12 (typically a wired connection, but in some cases a battery), that generates a time-varying electric field, and a receiver 15 including a receiver coil Ls and a serial capacitance Cs forming a similar serial resonant LC network in which the time-varying electric field induces an AC current. Other possible configurations exist where L and C are in parallel on the primary side and/or the secondary side, offering four possible schemes—serial-serial, serial-parallel, parallel-serial, and parallel-parallel. Each scheme may present some advantages and/or disadvantages depending on the application, and the serial-serial configuration is the most widely used in recent developments for the mobile device market. The receiver 15 includes a bridge rectifier 16 (comprised of the illustrated diodes D1-D4) that rectifies the AC current to produce a DC current that charges a tank capacitor Ctank connected to an input node Nin of a regulator 17 to a regulator input voltage. The regulator 17, typically a low dropout amplifier, produces a regulated output voltage at its output node Nout, which is provided to a load (represented by the load resistance R1 and the load capacitance C1).

In some designs, the receiver 15 is capable of data communication with the transmitter 11. In a well-designed wireless power transmission system, in steady-state operation, power measurement is performed at the transmitter 11 and the receiver 15, which communicate so as to keep power delivered and received at a desired level. In particular, the receiver 15 measures the power received and sends to the transmitter 11 this measurement so that the transmitter can assess whether there is a leakage of power to a foreign object, which is undesirable.

A design capable of such power measurement is shown in FIG. 2, where a sense resistor Rsense is coupled between a first output node N1 of the bridge 16 (with the second output node of the bridge being coupled to ground) and a node Nin that is coupled to the input of the voltage regulator 17. Here, the tank capacitor Ctank is coupled between node N1 and ground, and a rectified voltage VRECT forms at node N1. On the receiver 15 side, the overall received power is calculated as the power losses in the LC tank, the power losses in the rectifier, and the power delivered to the remaining circuitry (i.e., dissipated in Rsense, in the regulator and in some additional circuitry not illustrated but that may be connected to the node Nin). The receiver 15 also has the capability to calculate the power supplied to the load R1, by measuring voltage and current delivered to the load; thus, the power delivered to the load is calculated as VOUT (the voltage output by the regulator 17 to node Nout) multiplied by a current Isense through the sense resistor Rsense. The power loss contributors in the receiver 15 circuitry are calculated by relying on the measurement of Isense, shall they be of V*Isense or R*Isense$^2$ form. Since the current Isense is the common denominator to the power computations, it is useful for the current Isense to be accurately measured. The wireless power transmission system 10 of FIG. 2 some cases is not capable of measuring the current Isense to the degree of consistency over temperature desired.

Therefore, the wireless power transmission system 20 of FIG. 3 has been developed. Here, the transmitter is the same as in the systems described above, and is not shown or described for brevity. The bridge 16 is also the same as in the systems described above. A sense resistor Rsense is coupled between a first output node N1 of the bridge 16 (with the second output node of the bridge being coupled to ground) and a node Nin that is coupled to the input of the voltage regulator 17. A tank capacitor Ctank is coupled between node N1 and ground, and a rectified voltage VRECT forms at node N1.

A PNP transistor QP1 has its emitter coupled to node N1 to receive the rectified voltage VRECT, has its collector coupled to ground through current source 25, and has its base coupled to a source of a high voltage PMOS transistor MP1. Similarly, a PNP transistor QP2 has its emitter coupled to node Nin to receive an intermediate rectified voltage VRECT_INT, has its collector coupled to ground through current source 26, and has its base coupled to a source of a high voltage PMOS transistor MP2.

A current source 23 is coupled between node N1 and the source of the PMOS transistor MP1, and a current source 24 is coupled between node Nin and the source of the PMOS transistor MP2. A resistor Rs is coupled between the sources of the PMOS transistors MP1 and MP2, which have their drains coupled to the input of a chopper circuit 27. A resistor Rg is coupled between the drains of the PMOS transistors MP1 and MP2. PMOS transistors MP3 and MP4 have their sources coupled to the output of the chopper circuit 27 and their drains coupled to the drains of NMOS transistors MN1 and MN2. The gate of the PMOS transistor MP4 is coupled to a reference voltage VREF, and the drain of the PMOS transistor MP4 is coupled to the gate of the PMOS transistor MP3 through a diode, with a voltage VOUT being formed at the output of the inverter (which is coupled to the gate of MP3). The sources of NMOS transistors MN1 and MN2 are coupled to ground, and the gates of NMOS transistors MN1 and MN2 are coupled together and to the drain of MN1.

When current is not currently being supplied to the regulator 17, a current is outgoing from node N1 in direction of Rsense and VRECT_INT. This current is equal to biasing currents from the current sources 25, 23, 45, and 26, which may be referred to as I25, I23, I24, and I26. It is to be noted that the current I24+I26 is also flowing through Rsense creating a small offset in the current reading, but that this is not a big concern as provided it remains small and stable, as it can be removed by the chopper 27. When a load current is flowing to the regulator 17, it circulates through the resistor Rsense. Therefore, it deploys a voltage Rsense*Isense across the resistor Rsense. As I25, I23, I24, and I26 are fixed, the totality of the additional load current (additional on top of the biasing currents) flows through the resistor Rsense. Hence, the variation of Rsense*Isense is the actual image of the current to be measured. As the transistors QP1 and QP2 are emitter followers, the voltage Rsense*Isense is deployed across the resistor Rg. As the voltage is deployed across the resistor Rg, it creates a current I1=Vsense/Rs circulating in the current Rs. The current unbalances the current flowing in the transistors MP1/MP2, and therefore the current difference I1 is carried over at the drains of the transistors MP1/MP2. As the transistors MN1/MN2 are configured as current mirror, the transistors MP3 and MP4 have the same current. Consequently, I1 flows in the resistor Rg, hence creating the voltage VOUT=Rg*I1 across the resistor Rg, and therefore VOUT=Rg*Vsense/Rs=Rg*Rsense*Isense/Rs. As the transistors MP3 and MP4 are source followers and the gate of the transistor MP4 is biased at a fixed voltage, the voltage deployed across the resistor Rg is deployed at VOUT. It is to be noted that while the resistor Rs is attached to the high voltage domain as following the base voltages of the transistors QP1/QP2, the resistor Rg is attached to the low voltage domain as following the source of the transistors MP3 and MP4. MP1/MP2 are the two transistors performing the voltage translation from high voltage domain to low voltage domain. This voltage is translated by the chopper circuit 27 to a lower domain, and can then be measured as VOUT. VOUT is equal to (Rg/Rs)*Rsense*Isense. Since VOUT, Rg, Rs, and Rsense are known, Isense can therefore be calculated.

While this design may accurately provide for measurement of Isense in some instances, there are potential drawbacks. Due to the PNP transistors QP1 and QP2, there is leakage current, reducing efficiency. In addition, the high voltage PMOS transistors MP1 and MP2 have to be matched to avoid offsets, which can be exacerbated by the parasitic capacitances associated with these transistors. Still further, there may be more potential offset issues related to resistor matching, and piezo-electric effects. Consequently, the output voltage VOUT may not be as accurate as desired.

As such, further development is needed.

SUMMARY

A wireless power system described herein includes: a bridge; a coil coupled between first and second inputs of the bridge; a tank capacitor coupled between first and second outputs of the bridge; a regulator; a sense resistor having a first terminal coupled to the first output of the bridge and a second terminal coupled to an input of the regulator; a switching circuit having first and second inputs respectively coupled to the first and second terminals of the sense resistor; a gain stage having first and second inputs capacitively coupled to first and second outputs of the switching circuit; an analog to digital converter (ADC) configured to digitize output of the gain stage by comparing the output of the gain stage to first and second reference voltages; and a reference voltage generator comprising a temperature independent current source coupled to source current to a reference resistor, the reference resistor having a resistance that is a multiple of a resistance of the sense resistor and that tracks the resistance of the sense resistor across temperature variation, wherein the first differential reference voltage is formed across the reference resistor. The switching circuit is configured to, in a reset phase, short the first and second inputs of the gain stage to one another. The gain stage is configured to, in the reset phase, short its first and second inputs to its output. The switching circuit is configured to, in a first chopping phase, couple the first and second terminals of the sense resistor to the first and second inputs of the gain stage. The switching circuit is configured to, in a second chopping phase, couple the first and second terminals of the sense resistor to the second and first inputs of the gain stage.

Processing circuitry may be configured to perform filtering and de-chopping on the output from the ADC.

The switching circuit may be configured to, after the reset phase, alternate between the first and second chopping phases a given number of times at a rate equal to a sampling frequency of the ADC.

The switching circuit may be configured to, after the reset phase, switch between the first and second chopping phases a given number of times at a rate less than a sampling frequency of the ADC.

Processing circuitry may be configured to receive output from the ADC, to discard samples taken during transition between the reset phase and the first chopping phase, and to discard samples taken during transition between the first chopping phase and the second chopping phase.

The switching circuit may be configured to perform the reset phase between the first and second chopping phases.

The gain stage may include a first amplifier having a first input coupled to the first output of the switching circuit by a first high voltage capacitor, a second input coupled to the second output of the switching circuit by a second high voltage capacitor, a third capacitor coupling the first input of the first amplifier to a first output of the first amplifier, a fourth capacitor coupling the second input of the first amplifier to a second output of the first amplifier, a first switch selectively coupling the first input of the first amplifier to the first output of the first amplifier, and a second switch selectively coupling the second input of the first amplifier to the second output of the first amplifier.

The gain stage may also include a common mode feedback circuit coupling a common mode voltage between the first and second outputs of the first amplifier.

An anti-aliasing filter may receive input from the first and second outputs of the first amplifier, and provide output to the ADC.

The first and second high voltage capacitors may be metal-oxide-metal capacitors.

The gain stage may also include a second amplifier having a first input coupled to the first output of the first amplifier by a first low voltage capacitor, a second input coupled to the second output of the first amplifier by a second low voltage capacitor, a fifth capacitor coupling the first input of the second amplifier to a first output of the second amplifier, a sixth capacitor coupling the second input of the second amplifier to a second output of the second amplifier, a third switch selectively coupling the first input of the second amplifier to the first output of the second amplifier, and a fourth switch selectively coupling the second input of the second amplifier to the second output of the second amplifier.

The gain stage may also include a common mode feedback circuit coupling a common mode voltage between the first and second outputs of the first amplifier, and between the first and second outputs of the second amplifier.

An anti-aliasing filter may receive input from the first and second outputs of the second amplifier, and providing output to the ADC.

The switching circuit may include a first switch selectively coupling the first input of the switching circuit to the first output of the switching circuit, a second switch selectively coupling the first input of the switching circuit to the second output of the switching circuit, a third switch selectively coupling the second input of the switching circuit to the second output of the switching circuit, and a fourth switch selectively coupling the second input of the switching circuit to the first output of the switching circuit.

The reference resistor may be formed from a given number of resistance units spaced equally about a perimeter of the sense resistor.

The reference resistor may be separated into substructures placed in a centroid manner around the sense resistor.

The reference resistor and the sense resistor may be formed by at least two different resistive materials and for which the amount of contribution of each material in respect to an overall value of the resistance is identical for both the reference resistor and the sense resistor.

The reference resistor and the sense resistors may be formed from multiple resistive materials.

The multi-material nature of the reference and sense resistors may include part of each resistor being polysilicon and part of each resistor being metal.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
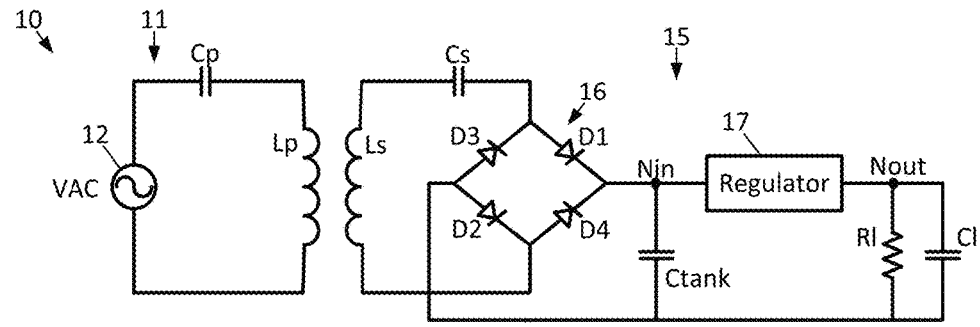
FIG. 1 is a schematic block diagram of a first prior art wireless power transmission system.
Figure 2:
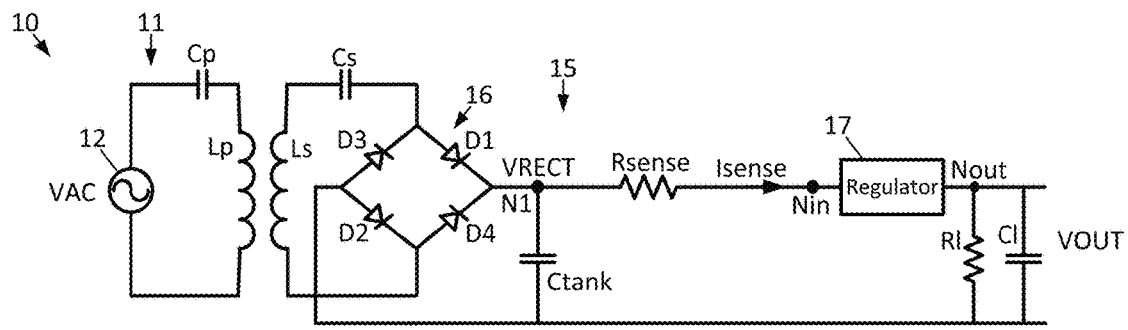
FIG. 2 is a schematic block diagram of a second prior art wireless power transmission system in which the receiver is capable of measuring received power.
Figure 3:
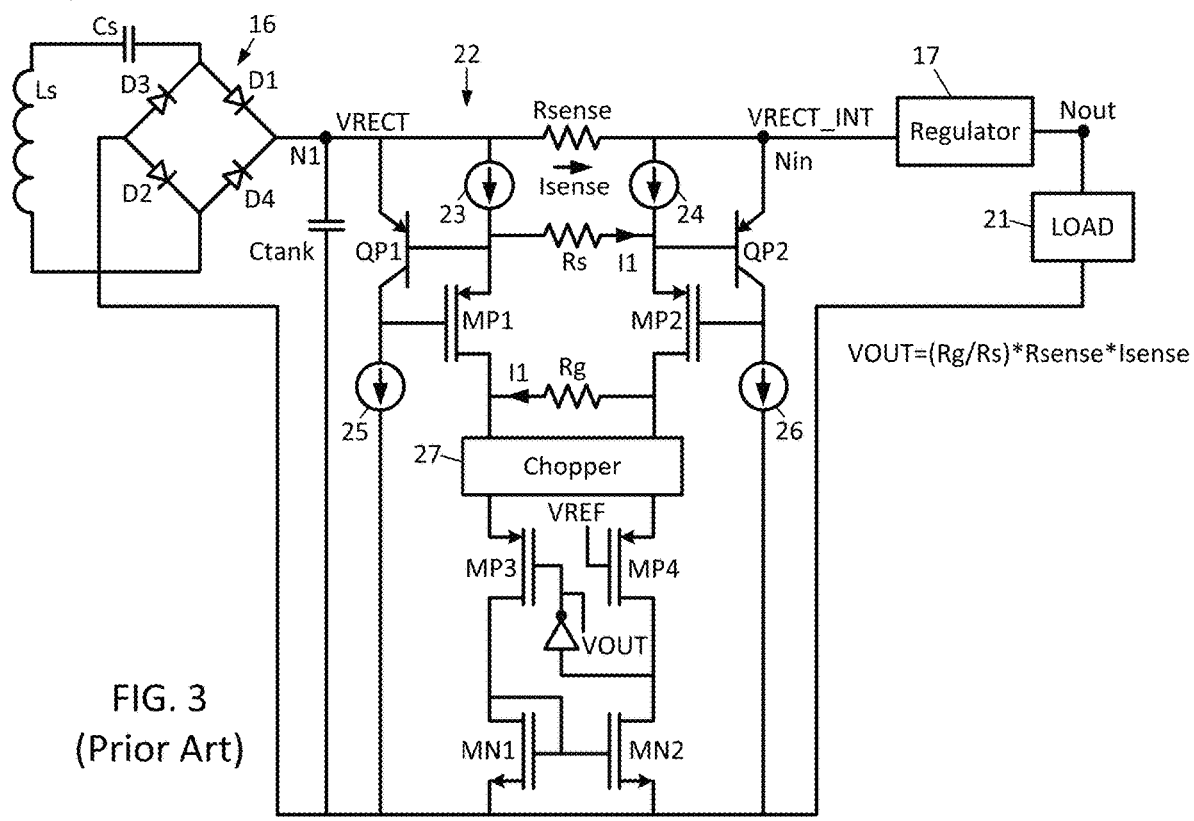
FIG. 3 is a schematic block diagram of a third prior art wireless power transmission system in which the receiver is capable of measuring received power.
Figure 4:
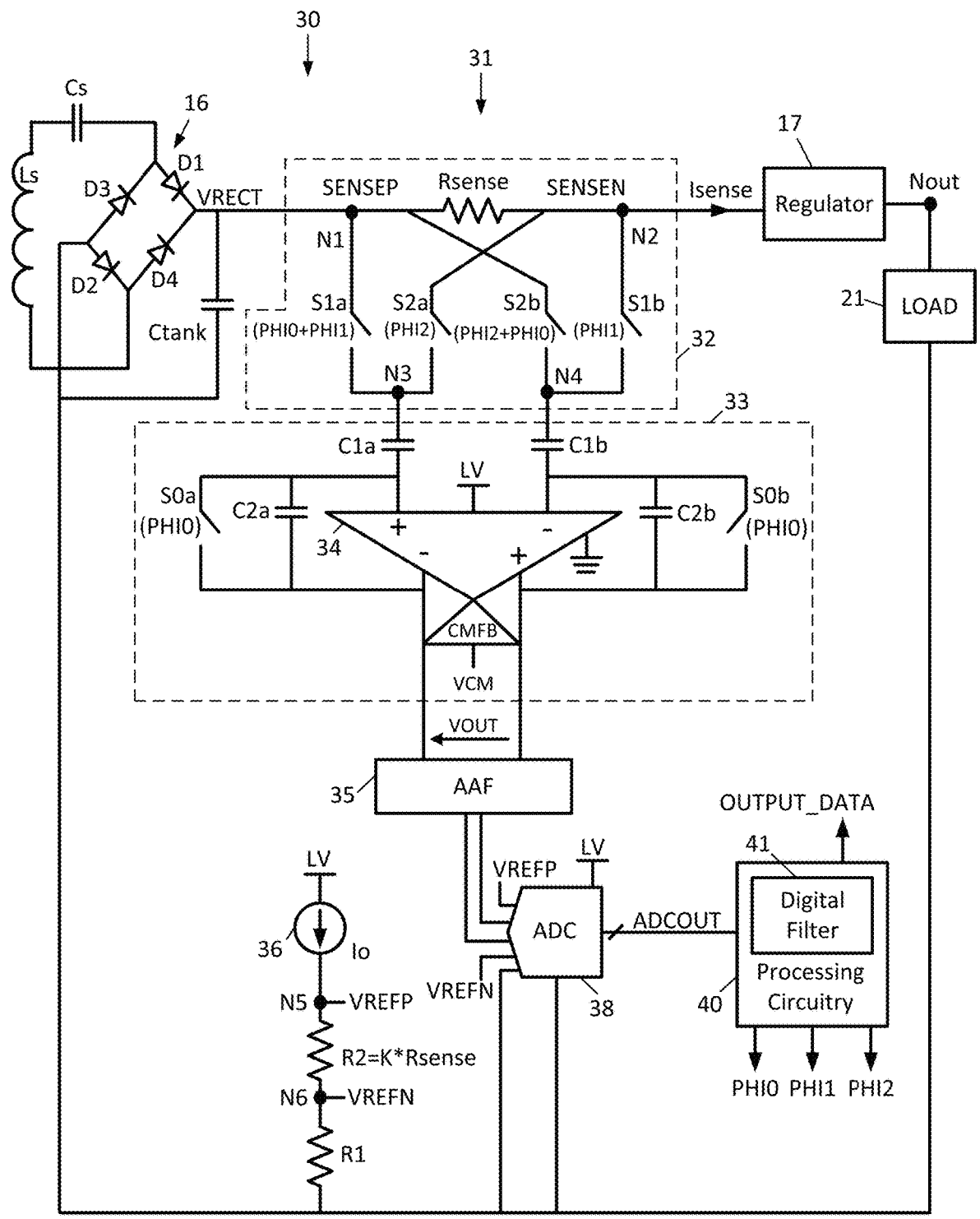
FIG. 4 is a schematic block diagram of a wireless power transmission system disclosed herein, in which the receiver is capable of accurately measuring received power despite changes in operating temperature.

Now described with reference to FIG. 4 is a wireless power transmission system 30 including a receiver 31 capable of accurate measurement of received power. The receiver 31 includes a receiver coil Ls and a serial capacitance Cs forming a similar serial resonant LC network in which the time-varying electric field generated by the transmitter (not shown for brevity) induces an AC current. The receiver 31 includes a bridge rectifier 16 (comprised of the illustrated diodes D1-D4 connected such that the cathode of D1 is coupled to the cathode of D4, the anode of D4 is coupled to the cathode of D2, the anode of D2 is coupled to the anode of D3, and the cathode of D3 is coupled to the anode of D1; the cathode of D3 and anode of D1 are coupled to the capacitance Cs, the cathode of D2 and anode of D4 are coupled to the receiver coil Ls, the anodes of D2 and D3 are coupled to a reference voltage such as ground, and the cathodes of D1 and D4 are coupled to a node N1). A tank capacitor Ctank is coupled between the node N1 and the reference voltage (hereinafter referred to as ground), and a rectified voltage VRECT is formed across the capacitor Ctank.

A sense resistor Rsense (for example, about 20 mΩ) is coupled between node N1 and node N2. An issue arises in that the resistance value of Rsense may be affected by temperature, and the system may be unable to compensate for this change in Rsense. Also as the resistance is substantially large in area for coping with low resistivity and electromigration desires, it may be subject to mechanical constraints, and piezo-electric effects in the silicon may vary its value. Beside trying to address the latest by properly positioning the resistance in the chip, which may not be easily accomplished, one way to address this potential issue is to have Rsense be an external resistance so that it does not vary appreciably with temperature of the system, and so that it is not subject to mechanical stress. However, this adds cost to the system. In addition, such an external resistance is not ideal, and therefore may not actually have its resistance equal to its intended resistance, for example by ±0.5%. Moreover, due to variation introduced in the system itself, if specifications call for the Rsense to vary by no more than ±0.5% in operation, then in actuality, the external resistor forming Rsense itself would be specified to vary in resistance by no more than ±0.1%.

Another approach for forming the sense resistance Rsense is to use an internal resistance formed from a material known to vary minimally with temperature and arranged into a structure to permit trimming. However, this is also costly to implement.

Therefore, as will be explained, in the receiver 31, so as to avoid the need for a costly implementation of Rsense, two reference voltages VREFP and VREFN will be generated so that their voltage difference varies over process, voltage, and temperature together with the resistance of Rsense. The generation of VREFP, VREFN will be explained below.

Returning now to the description of the receiver 31, a regulator 17 is coupled between node N2 and an output node Nout, and the load 21 is coupled between the output node Nout and ground.

A high voltage multiplexer 32 is connected to receive input voltages SENSEP and SENSEN from nodes N1 and N2. The high voltage multiplexer 32 includes a switch S1a coupled between node N1 and node N3, a switch S2a coupled between node N2 and node N3, and switch S2b coupled between node N1 and node N4, and a switch S1b coupled between node N2 and node N4. Switches S1a and S1b are closed when control signal PHI1 is asserted and are otherwise open; switches S2a and S2b are closed when control signal PHI2 is asserted and are otherwise open.

A low voltage amplifier circuit 33 includes a low voltage amplifier 34 having a non-inverting input coupled to node N3 through a capacitor C1a, and an inverting input coupled to node N4 through a capacitor C1b. A capacitor C2a and switch S0a are coupled in parallel between the non-inverting input of the low voltage amplifier 34 and the inverting output of the low voltage amplifier 34. The switch S0a is closed when the control signal PHI0 is asserted and is otherwise open.

Similarly, a capacitor C2b and switch S0b are coupled in parallel between the inverting input of the low voltage amplifier 34 and the non-inverting output of the low voltage amplifier 34. The switch S0b is also closed when the control signal PHI0 is asserted and is otherwise open.

In the above, it is to be noted that the capacitors C1a, C1b, and C2a, C2b are high voltage metal-oxide-metal (HV-MOM) capacitors, and that the switches S1a, S1b and S2a, S2b are high voltage switches, for example implemented using MOSFET devices. It is to be noted that it is not functionally required that C2a and C2b are high voltage as they are not subject to high voltage across the terminals. However, for matching reasons it may be helpful if C2a and C2b are of same nature than C1a and C1b.

An output common mode feedback circuit CMFB is coupled between the inverting and non-inverting outputs of the low voltage amplifier 34, and sets a common mode voltage VCM for those outputs. The output voltage VOUT is a differential voltage formed between the non-inverting output and inverting output of the low voltage amplifier 34.

An anti-aliasing filter (AAF) 35 has inputs coupled to the outputs of the low voltage amplifier 34, and provides differential inputs to an analog to digital converter (ADC) 38. The ADC 38 receives reference voltages VREFP and VREFN for use in converting the differential inputs received from the anti-aliasing filter 35 to a digital output signal ADCOUT.

Processing circuitry 40 receives the digital output signal ADCOUT and produces output data OUTPUT_DATA. The processing circuitry also generates the control signals PHI0, PHI1, and PHI2.

The reference voltages VREFP, VREFN are generated by a current source 36 that outputs a current I0 (for example, about 10 µA) to a resistor R2 coupled between N5 (probed as VREFP) and N6 (probed as VREFN). A resistance R1 is coupled between VREFN and ground and receives therefore the same current I0. The resistor R2 is equal in resistance to the sense resistor Rsense multiplied by a factor K. The resistor R1 is generally chosen to be small in resistance, and VREFN is therefore close to ground value. However R1 is shown for underlining that it is particularly useful for VREFN to be specifically probed from node N6.

The resistors Rsense (for example, about 20 mΩ) and R2 (for example, about 100 KΩ) are poly resistors formed in the same process technology, and are physically laid out on silicon so as to vary the same with PVT. For this reason as well, variance in the resistances of Rsense and R2 resulting from mechanical forces imposed on the chip containing the system 30 tracks one another. Therefore, the reference voltage VREFP tracks the variation in Rsense, enabling ratiometric conversion of the output of the anti-aliasing filter 35 by the ADC 38.

The specific structure and formation of Rsense and R2 will be described in detail below, but first, the operation of the receiver 31 will be described. It should be noted that the resistors Rsense and R2 are to be implemented in the same region of the integrated circuit so that the temperature is similar for these resistors. It is not necessary that Rsense and R2 are implemented in the region into which the remaining of the receiver 31 (switches 32, amplifier 33, AAF 35, ADC 38 and the current source 36) are implemented. Rather, given that R2 and Rsense are subject to large mechanical stress due to their significant area on the silicon, what matters at first is that R2 and Rsense track together, despite being remotely laid out from the remaining of the receiver 31. The remaining of the receiver 31 may itself be placed at a location where mechanical stress is minimum. As such the essence of a good layout for the receiver 31 is specifically that R2 and Rsense are remotely placed and allowed to be subjected to their local mechanical stress, but that they are compensated locally by good matching, while the remainder of the receiver 31 is a compact small circuitry placed away from mechanical stressed regions, with the function of injecting current I0 on node N5 and extracting current I0 from node N6, and probing voltages from terminals N3 and N4. As such, R1 does not need to be implemented close to R2 and Rsense, but can reside with the remaining of the receiver 31. Also, it is to be noted that nodes N3 and N4 used for probing Rsense voltage, and nodes N5 and N6 used for probing VREFP and VREFN, are the links between the two distinct layout regions. They are differential links and can be realized with long wires connecting the R2/Rsense remote region to the remaining of the receiver 31. As such, the layout of the full structure is advantageously partitioned into two distinct regions, one region being allowed its own intrinsic R2 and Rsense variations which compensate with a ratiometric approach, while the other region of the remaining of the receiver 31 relies mainly on the stability of current I0. It is to be noted as well that N5 (VREFP) and N6 (VREFN) will be advantageously decoupled by a bypass capacitor.

The current I0 is to be temperature independent, and may be generated using the circuit of United States Patent Publication Number 20200169221, filed Nov. 27, 2018, the contents of which are incorporated by reference in their entirety to the maximum extent allowable under the law. Since ideally Rsense and R2 will perfectly track across temperature, but in reality may differ slightly across temperature, the slope of the current I0 may be adjusted to compensate, and such adjustment is described in the aforementioned circuit of United States Patent Publication Number 20200169221, filed Nov. 27, 2018.

Figure 5:
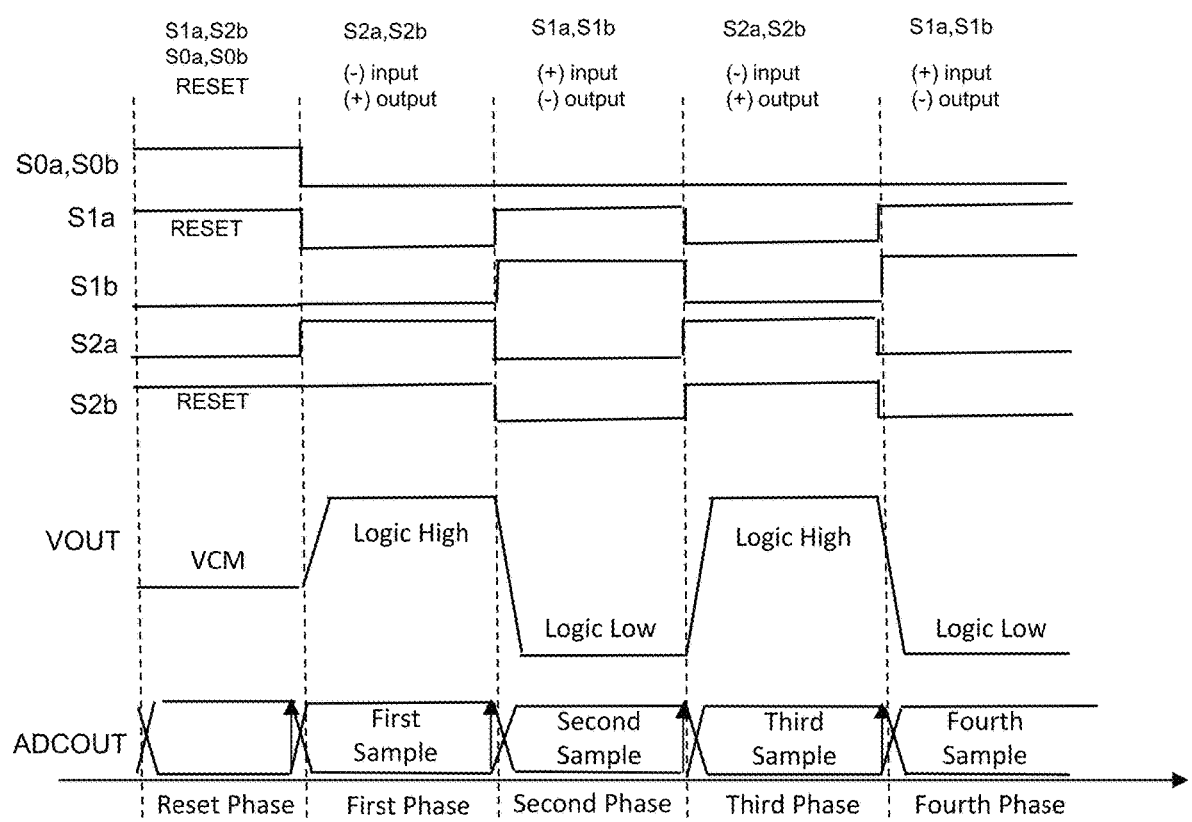
FIG. 5 is a timing diagram of the wireless power transmission system of FIG. 4 in operation.

With additional reference to FIG. 5, in operation, during a reset phase the voltage across N3 and N4 is reset by asserting PHI0. As such, S1a is controlled with a signal being a logical OR of PHI0 and PHI1 and S2b is controlled by a signal being a logical OR logic PHI2 and PHI0. The assertion of PHI0 causes closing of switches S1a and S2b, setting the voltage at the top plates of the capacitors C1a and C1b to be equal to Vrect. Also during this first phase when PHI0 is asserted, the low voltage amplifier 34 is reset, for example for 500 ns, closing the switches S0a, S0b, setting the inputs to the low voltage amplifier 34 to the common mode voltage VCM due to the common feedback regulation circuitry CMFB. In this reset condition, the low voltage amplifier 34 is auto zeroed and any offsets are stored in the capacitors C1a and C1b. Thus, as can be seen in FIG. 5, the voltage VOUT is set to the common mode at this point, but the ADC 38 does not yet sample (or the sample taken is discarded).

Then, a first phase begins, and PHI0 is released, and PHI1 is not yet asserted, and PHI2 is asserted. This opens switches S0a, S0b, and S1a, S1b, while closing switches S2a, S2b. Thus, node N3 is coupled to node N2, and node N4 is coupled to node N1. The voltages SENSEP and SENSEN at nodes N1 and N2 self-adjust based upon VRECT and the current draw from the regulator 17. The ADC 38 samples VOUT after anti-aliasing is performed by the AAF, and here VOUT is VCM. Thus, a first sample of VOUT is taken, as can be next seen in FIG. 5. This sample is equal to Rsense*Isense, multiplied by the gain (here, 20×) of the low voltage amplifier 34.

Next, during a second phase, PHI0 continued to be deasserted, maintaining the switches S0a and S0b open, and PHI1 and PHI2 are deasserted, opening the switches S1a, S1b and S2a, S2b. After the switches S1a, S1b are opened, then PHI1 is asserted again for example for 500 ns, closing switches S1a, S1b to thereby charge capacitor C1a to SENSEP and charge capacitor C1b to SENSEN. The gain of the low voltage amplifier 34 is set by the capacitors C1a, C1b and C2a, C2b so that the voltage across Rsense (here, −Rsense*Isense) is multiplied by the gain (here, 20×) to produce VOUT, which is sampled (after anti-aliasing by AAF) by the ADC 38. Thus, a second sample of VOUT is taken.

During a third phase, the inputs to the low voltage amplifier 34 are again swapped. Thus, PHI1 is deasserted, opening switches S1a and S1b, and PHI2 is asserted, closing switches S2a and S2b, for example for 500 ns, charging capacitor C1a to SENSEN and charging capacitor C1b to SENSEP. The voltage across Rsense (here, Rsense*Isense) is multiplied by the amplifier to produce VOUT, which is sampled (after anti-aliasing by AAF) by the ADC 38. Thus, a third sample of VOUT is taken. Therefore, appreciate that the switching between the second phase and the third phase is a chopping of the voltage across Rsense from a high voltage domain (VRECT) to a lower voltage domain suitable for reading by the low voltage amplifier 34.

This chopping may be repeated to produce a desired number of samples of ADCOUT that may be digitally filtered, and may be performed at the sampling frequency. Additional instances of the reset phase may be performed every given number of phases, if desired.

Due to the design of the receiver 31 where Rsense and R2 track one another, and where the current I0 is temperature independent or tracks Rsense, if there is remaining variation from R2 and Rsense matching, variation in the resistances of Rsense and R2 is canceled out from the samples reported by the ADC 38 as ADCOUT due to the use of VREFP, VREFN by the ADC 38 when digitizing VOUT.

Each ADC sample reported will be:

$$ADCOUT = \frac{2 * Rsense * Isense * G}{2 * (VREFP - VREFN)} * 2^n$$

where n is the differential input range and G is the gain of the low voltage amplifier 34.

This can be rearranged as:

$$Isense = \frac{ADCOUT}{2^n} * \frac{(VREFP - VREFN)}{G * Rsense} = \frac{ADCOUT}{2^n} * \frac{R2 * I0}{G * Rsense} = \frac{ADCOUT}{2^n} * \frac{K * Rsense * I0}{G * Rsense} = \frac{ADCOUT}{2^n} * \frac{K * I0}{G}$$

where n is the differential input range, G is the gain of the low voltage amplifier 34, and K is ratio between R2 and Rsense.

The processing circuitry 40 includes a suitable digital filter 41 that may, for example, perform de-chopping on the output ADCOUT of the ADC 38 to produce the output data OUTPUT_DATA.

Since the current I0 is temperature independent, given that the gain G is insensitive to temperature due to the use of MOM capacitors C1a, C1b and C2a, C2b in the amplification circuit 33, and given that Rsense and R2 will track one another across PVT, Isense as calculated is therefore temperature insensitive. As highlighted, in the event where R2 and Rsense do not perfectly match due to temperature variation, I0 is offering flexibility to slightly tilt its slope in temperature for precisely compensating the mismatch.

Additional benefits provided by the receiver 31 are multiple. For example, the common mode rejection ratio of the low voltage amplifier 34 that could result from the attachment of the low voltage amplifier 34 to the high voltage across Rsense is addressed through the use of the high voltage capacitors C1a, C1b and C2a, C2b, as well as the lack of large parasitic capacitances in the multiplexer 32. In addition, large high-voltage devices are not used for cascading the high voltage across Rsense down to the lower voltage domain utilized by the low voltage amplifier 34. Still further, flicker noise is not introduced by this design. Furthermore, as stated, offsets and drifts due to temperature are addressed through the tracking of the resistors Rsense and R2 to one another together with the ratiometric analog to digital conversion. Due to the AC coupling of the SENSEP and SENSEN voltages at nodes N3 and N4 to the inputs of the low voltage amplifier 34, input offset currents are not present. Also, since the gain of the amplifier circuit 33 is controlled by the MOM capacitors C1a, C1b and C2a, C2b, the gain is resilient to change due to mechanical stresses. Additionally, the auto-zeroing of the amplification circuit 33 performed during the first phase (reset phase), and chopping of the SENSEP and SENSEN voltages performed by switching between the second and third phases, helps to cancel residual offset effects.

Figure 6:
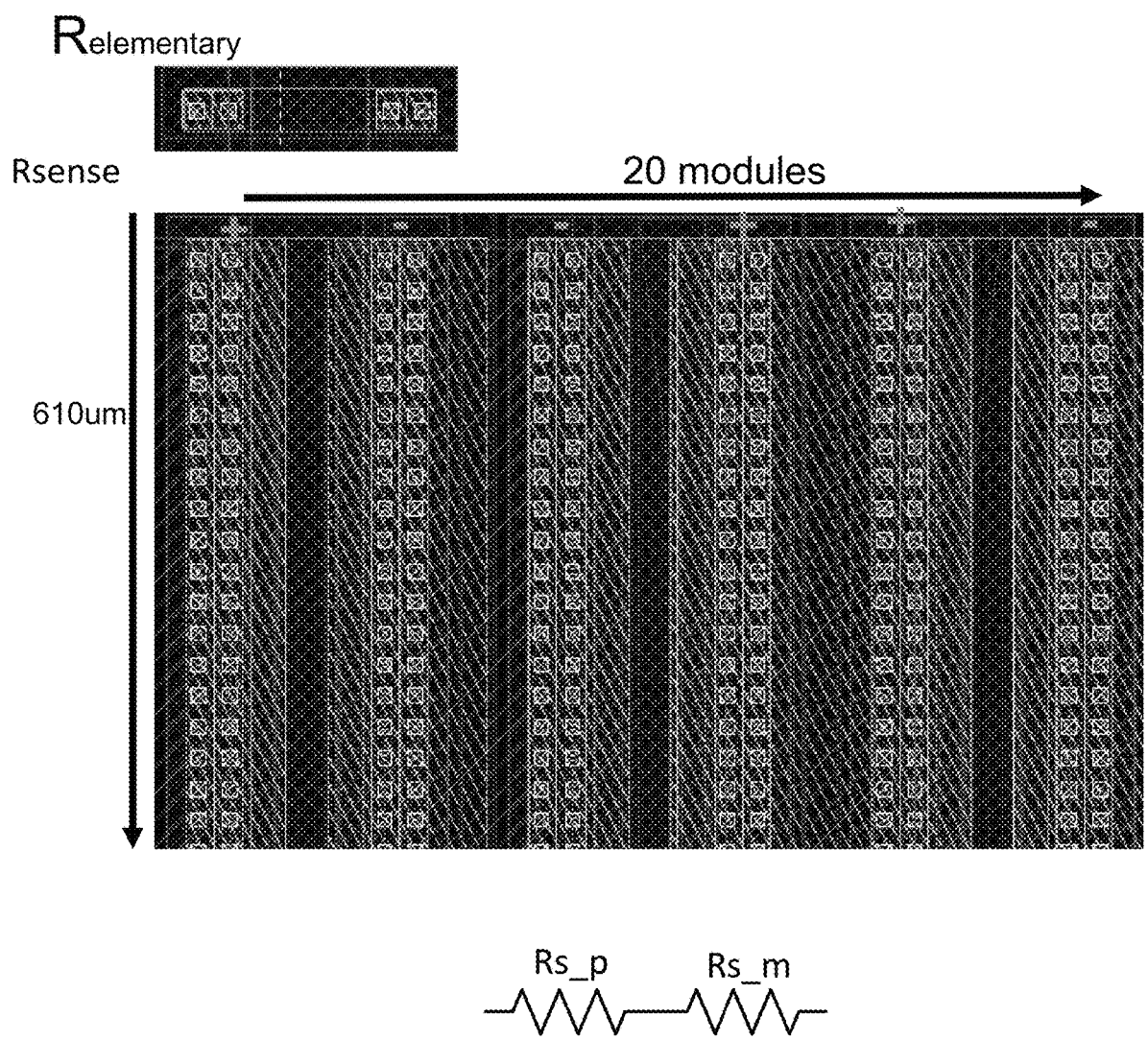
FIG. 6 is a top layout view showing the structure of the sense resistor Rsense of the wireless power transmission system of FIG. 4.

The structure of the sense resistance Rsense is now described with reference to FIG. 6. As stated, it is desired for Rsense (for example, 20 mΩ) and R2 (for example, 100 KΩ) to track one another. To obtain Rsense, multiple pieces N+POLY may be connected in parallel. For example, "elementary" pieces of N+POLY resistor, each 0.57 µm in width and 1.58 µm in length, may be formed, and may each have an elementary resistance of 501.5Ω. By connecting 1070 of these elementary pieces in parallel by their respective terminals making contact, modules of 610 µm in width and 1.58 µm in length may be formed, and each such module has a resulting theoretical resistance of 0.468Ω. Practically, because abutting the modules in direct contact is not physically equivalent to electrically parallelizing the individual modules, it turns that the actual resistance is 0.401Ω. An approach by simply parallelizing the modules is not chosen as it would consume too much silicon area because of the spacing used between modules. Moreover, the error between the theoretical and the actual value is deterministic and treated as a gain error in the system. What matters is that the temperature coefficients of the bigger module is being identical to the temperature coefficient of the elementary module which is achieved as far as its polysilicon portion is concerned, as it is inherent to the polysilicon physical behavior. By connecting 20 of these modules in parallel (and here we are now referring to actual electrical parallelizing of the modules) using a metal layer, a resistor of close to 20 mΩ is formed. However, it should be appreciated that for connecting in parallel the 20 large modules, some metal connections have to run from one side to the other of the resistance. Having in mind that the sheet resistance of the metallization is in the range of tens of milliΩ per square, it turns that it is not possible to ideally parallelize the 20 module and target 20 mΩ, without introducing significant excess of metal resistance on top of the poly contribution. Note that the actual resistance will therefore be higher since the total actual resistance results from not only the resistance of the modules (shown as Rs_p in FIG. 6), but also the resistance of the metal making the requisite connections (shown as Rs_m in FIG. 6). Practically, a target Rs_p can be determined from the electrical simulation of the twenty elements electrically parallelized, and an actual Rs_p can be determined from electrical simulation of the complete structure after parasitic metallization extraction with a 2D simulator. From there, the Rs_m contribution can be appreciated to a certain amount which reveled to be ~15% of the overall resistance value in the example.

Figure 7:
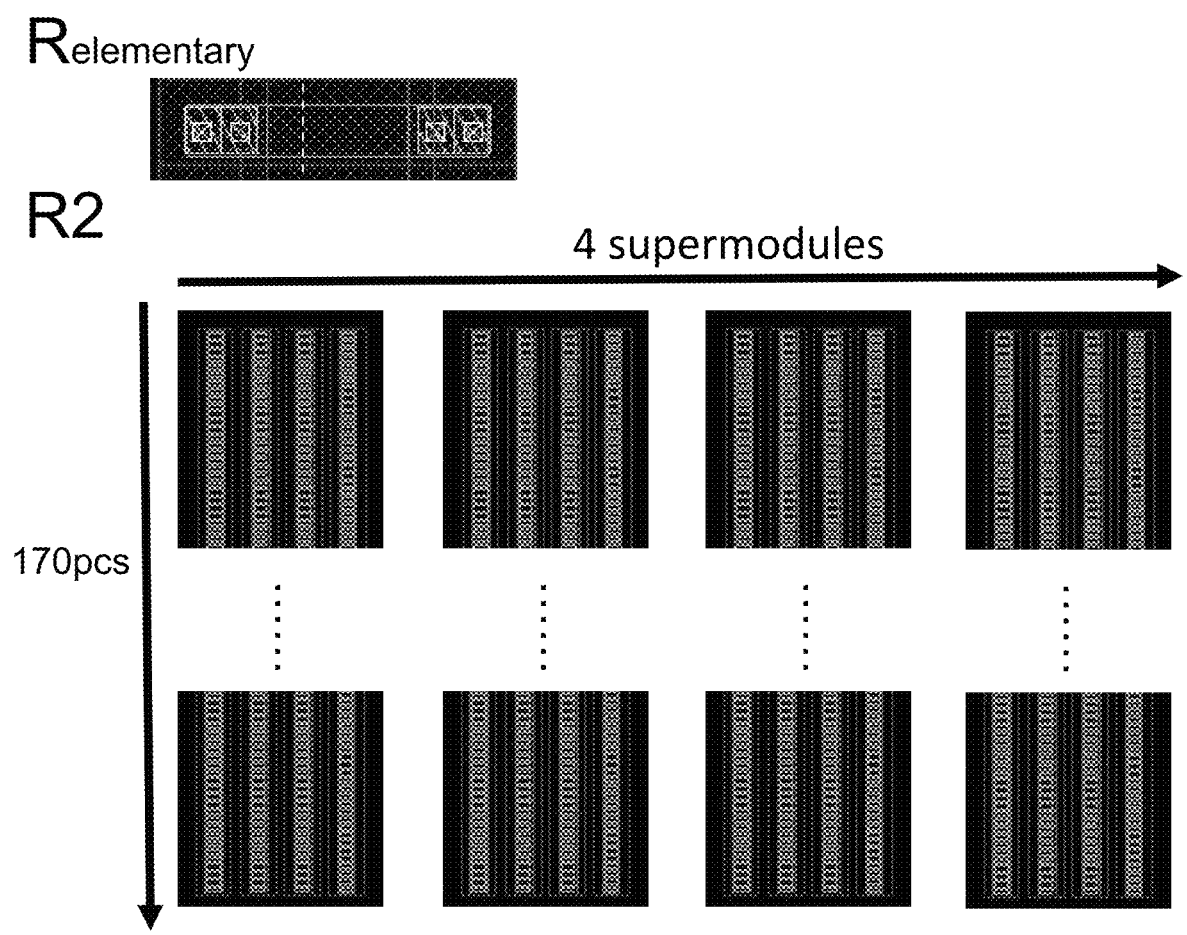
FIG. 7 is a top layout view showing the structure of the poly layer of the resistor R2 of the wireless power transmission system of FIG. 4.

The structure for the resistance R2 is now described with reference to FIG. 7. The structure for R2 is constructed from the same 0.57 µm wide, 1.58 µm long elementary pieces of N+POLY resistor. However, here, modules are formed from 170 elementary pieces in series, and supermodules are formed from four modules in parallel, each supermodule having a resistance of 21313Ω. Four supermodules are then serially connected for a total of 85255Ω. Opposite to the Rsense situation in which the metal contribution was dominant when targeting 20 mΩ by paralleling twenty pieces of 0.401Ω using a few tens of mΩ metal sheet inter connections, the metal contribution when placing the elements is series is negligible. One piece of metal used to inter connect the terminal of a 501.5Ω to another 501.5Ω may be 2 squares of few tens of mΩ, which is about equal to 0.01% impact. Therefore, the good matching of Rsense an R2 in temperature can be achieved if R2 is also factoring in a 15% of metal contribution, because the polysilicon and the metal have different temperature coefficients, and the ratio of Rsense over R2 can reject the temperature variation if they are ratiometric from this perspective. Hence, the poly portion of R2 (85 kΩ) will be complemented with a metal portion of 15 KΩ for a total of 100 KΩ.

Figure 8:
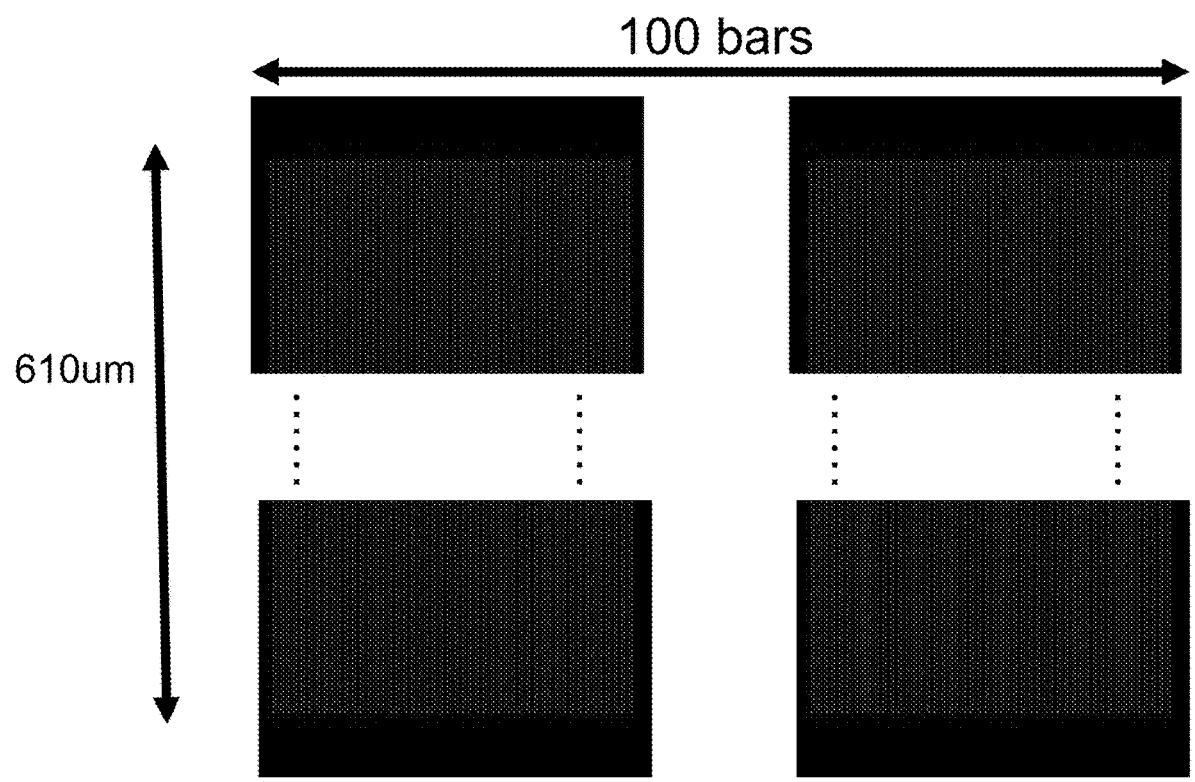
FIG. 8 is a top layout view showing the structure of the metal layer of the resistor R2 of the wireless power transmission system of FIG. 4.

The metal itself is shown in FIG. 8, where it can be seen that 100 metal bars are utilized to form the requisite connections. Each metal bar is 610 µm in width and 0.28 µm in length, and has a resistance of 159Ω, therefore the metal bars contribute an overall total resistance of 15.9 KΩ. The path the metal layer takes is designed so as to use the requisite number of metal bars (here, 100) so as to achieve the desired resistance for the metal layer.

Figure 9:
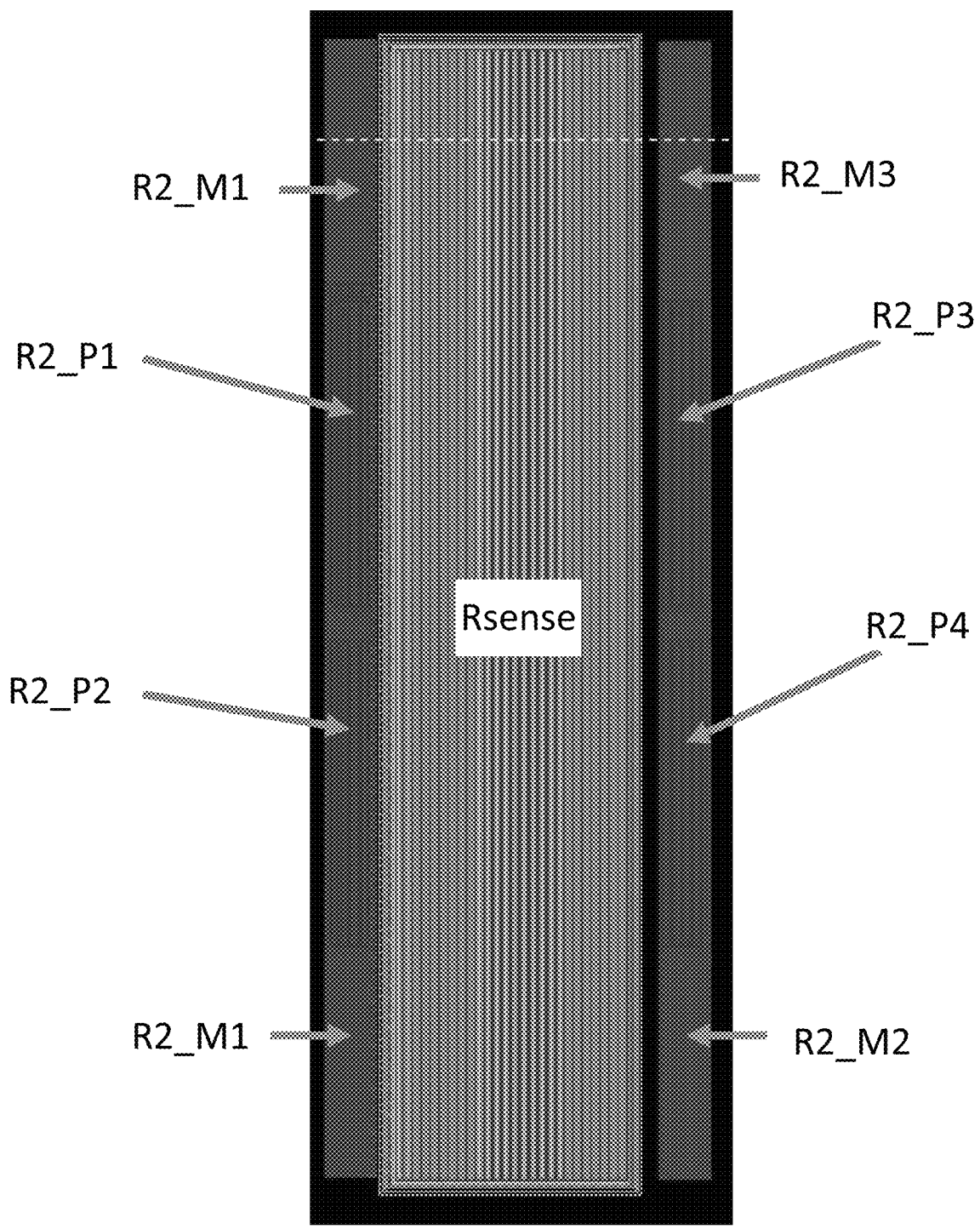
FIG. 9 is a top layout view showing the integration of the resistor R2 and sense resistor Rsense of the wireless power transmission system of FIG. 4 in a same semiconductor substrate location.

As stated above, it is desired for the resistors Rsense and R2 to be formed closely to one another so as to be at substantially the same temperature during operation. One potential structure for accomplishing this is shown in FIG. 9, where it can be seen that the structure forming Rsense is centrally located, with the N+POLY structures of four supermodules R2_P1, R2_P2, R2_P3, and R2_P4 forming R2 being distributed about Rsense, with R2_P1 and R2_P2 being on one side of Rsense and Rs_P3 and R2_P4 being on the other side of Rsense. In addition, the metal structures of the four supermodules R2_M1, R2_M2, R2_M3, R2_M4 forming R2 being on respective sides of Rsense. It should be appreciated that R2 is purposely separated into substructures (here, the four supermodules and their associated metal layers) such that it can occupy equal space on each side of Rsense, contributing to R2 having substantially the same operating temperature as Rsense, while being as well a centroid layout for rejecting gradients of effects in general as well known from those skilled in the art. The four modules each formed of a Ri_Mi in series with its associated Ri_Pi are to be connected in series for forming the overall R2 formed of an overall R2_M and an overall R2_P, the proportion of the overall R2_M to the overall R2 being equal to the proportion of the overall R1_M to the overall R1 constituted of R1_M and R1_P.

The circuits and operating techniques for the receiver 31 of the wireless power transmission system 30 described above are particularly precise and robust.

Figure 10:
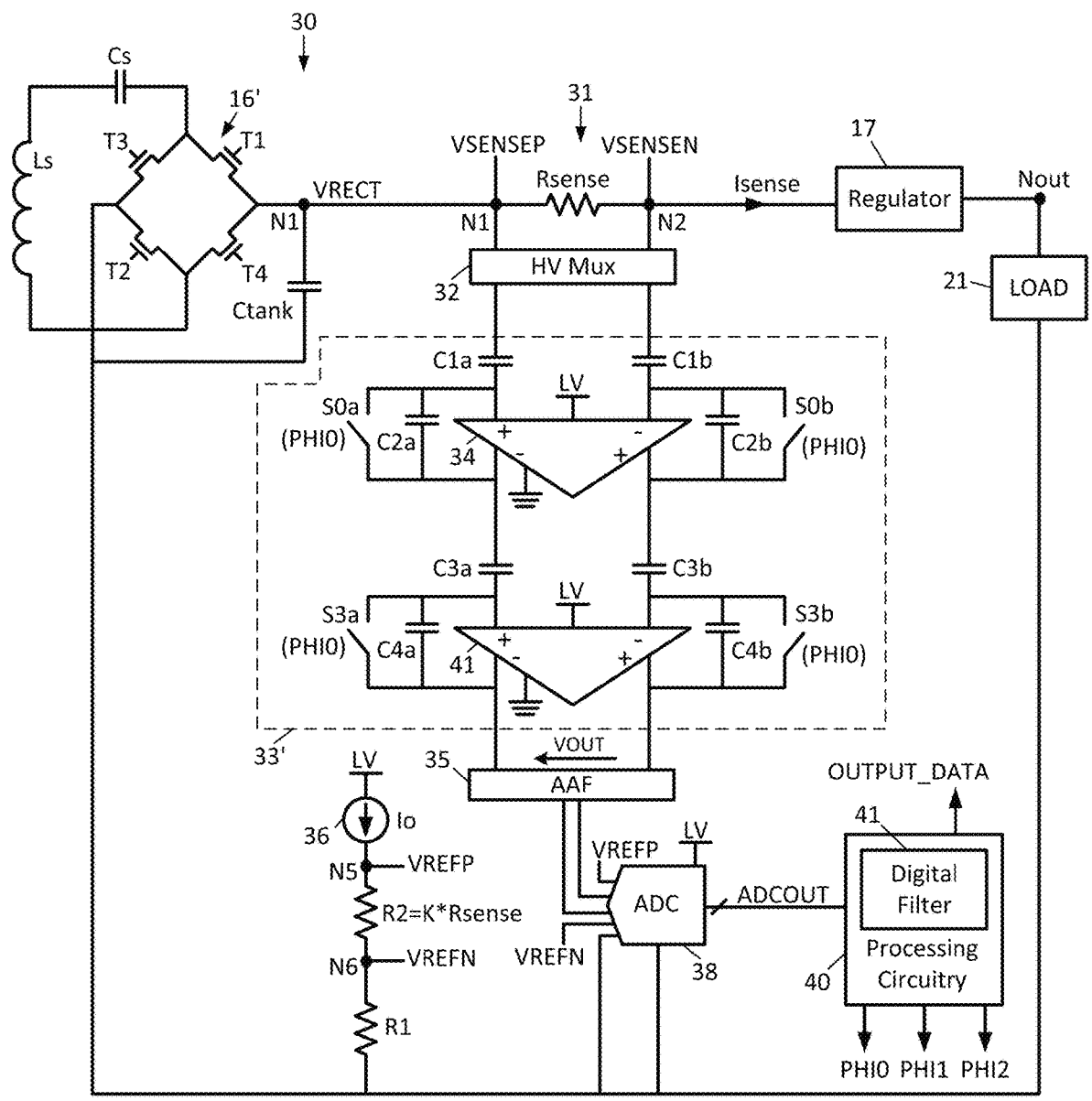
FIG. 10 is a schematic block diagram of a wireless power transmission system disclosed herein, in which the illustrated transceiver is capable of accurately measuring received power despite changes in operating temperature.

However, in some cases such as that shown in FIG. 10, it may be desired for there to be a transceiver 31' instead of a receiver, so as to permit operation as a transmitter as well as a receiver. Therefore, here, the rectifier 16' is comprised of transistors T1-T4 instead of diodes, and the transmitters may be operated so as to perform either rectify incoming alternating current to produce a DC current that charges the tank capacitor Ctank, or to invert DC current to produce an alternating current in the coil Ls that induces an alternating current in an adjacent receiver coil.

When operating as a transmitter 16', additional concerns may arise in sensing the current across Rsense. During such operation, the chopping performed by the multiplexer 32 is useful for canceling offset and low frequency noise, yet it can introduce distortion due to the speed limitations of the amplification circuit 33' itself.

Also, the magnitude of the measured voltage may call for a large amplification, in turn calling for a large C1/C2 ratio, which may in turn imply a large C1 as C2 has a minimum reasonable value below which it is not recommended to go without any side effects. As C1, C2 are high voltage capacitances for voltage sustainability and matching reasons, it may be advantageous to split the overall gain and use two stages, the first stage providing for example a gain of 4 using limited C1, C2 sizes and high voltage capacitances, while the second stage provides a gain of 5 and advantageously used low voltage capacitors C3, C4 as described below.

The amplification circuit 33' now includes a second low voltage amplifier 41 cascaded with the first low voltage amplifier 34. Since the multiplexer 32 converts the high voltage across the sense resistor Rsense to the low voltage domain, low voltage capacitors C3a and C3b are respectively coupled between the inverting output of amplifier 34 and non-inverting input of amplifier 41 and between the non-inverting output of amplifier 34 and inverting input of amplifier 41. In addition, a low voltage capacitor C4a is coupled between the non-inverting input and inverting output of amplifier 41, and a low voltage capacitor C4b is coupled between the inverting input and non-inverting output of amplifier 41. Thus, here, it is the output of amplifier 41 that is VOUT, and that is coupled to the input of the antialiasing filter AAF. Note that here, the common mode feedback circuits associated with the amplifiers 34 and 41 are not shown for brevity, and likewise the details of the multiplexer 32 are not shown for brevity, as the details of both are the same as with the amplification circuit 33 of FIG. 4. The splitting of the gain of the amplification circuit 33' across two cascaded amplifiers 34 and 41 serves to relax the specifications required of the amplifier 34, since the sampling is performed on the output of the amplifier 41.

Figure 11:
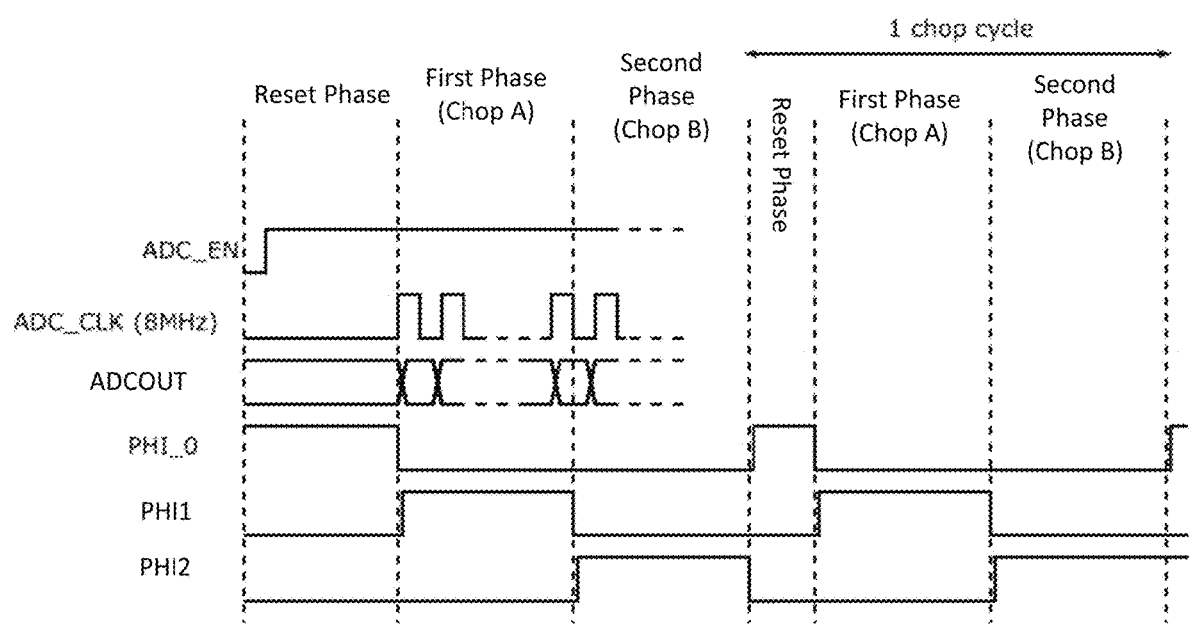
FIG. 11 is a timing diagram of the wireless power transmission system of FIG. 10 in operation.

Operation of the transceiver 31' is shown in FIG. 11, where it can be observed that the chopping frequency is much less than the sampling frequency. Here, the sampling frequency is 8 MHz, while the chopping frequency is 20 KHz. Therefore, the ADC is enabled and the reset (as described above) is performed during a reset phase. The next phase is a "Chop A" phase (first phase as described above) during which 200 data samples are acquired (200*⅛ MHz=25 uS, which is half of 20 kHz period). The next phase is a "Chop B" phase (second phase as described above) during which 200 data samples are also acquired. After every Chop B phase, another reset phase is performed.

Figure 12:
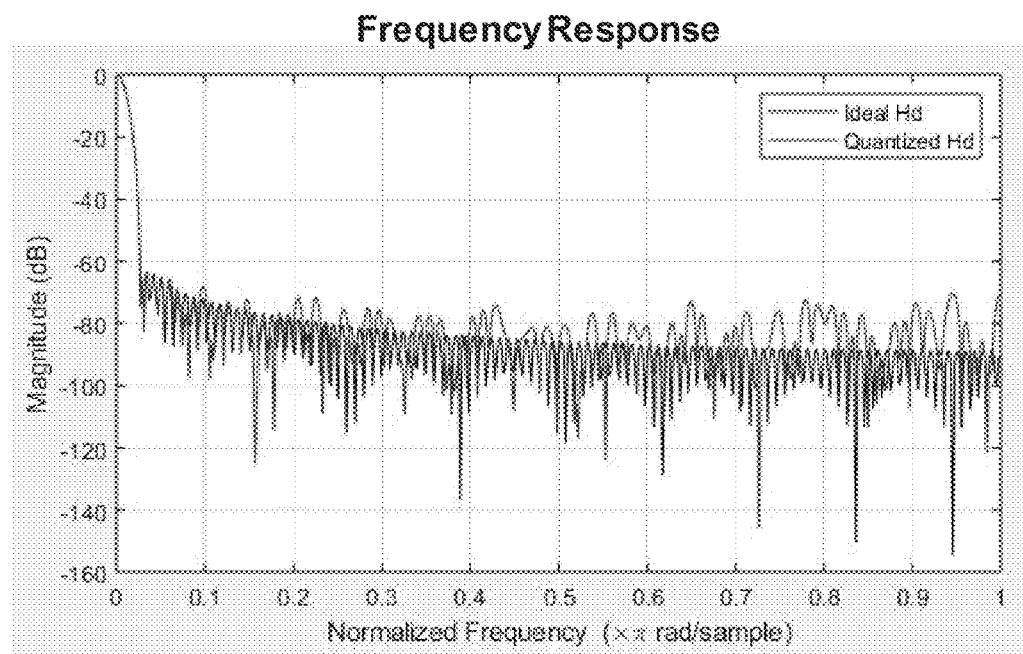
FIG. 12 is a graph showing frequency response of the wireless power transmission system of FIG. 10.

The digital filter 41 may be a 200 tap finite impulse response filter with a dechopper to remove the noise introduced by the chopping being performed at a much lower frequency than the sampling, for example. The frequency response of the system 30 can be seen in FIG. 12, where 0.5 on the x-axis corresponds to fs/2=4 MHz, and the attenuation of the filter is seen around −60 dB at 0.02*fs=160 kHz. In other words, noise or unwanted component above 160 kHz is strongly filtered and the system able to deliver an averaged value of a triangular current at 160 kHz which would occur when a transmitter is transmitting at 80 kHz.

Figure 13:
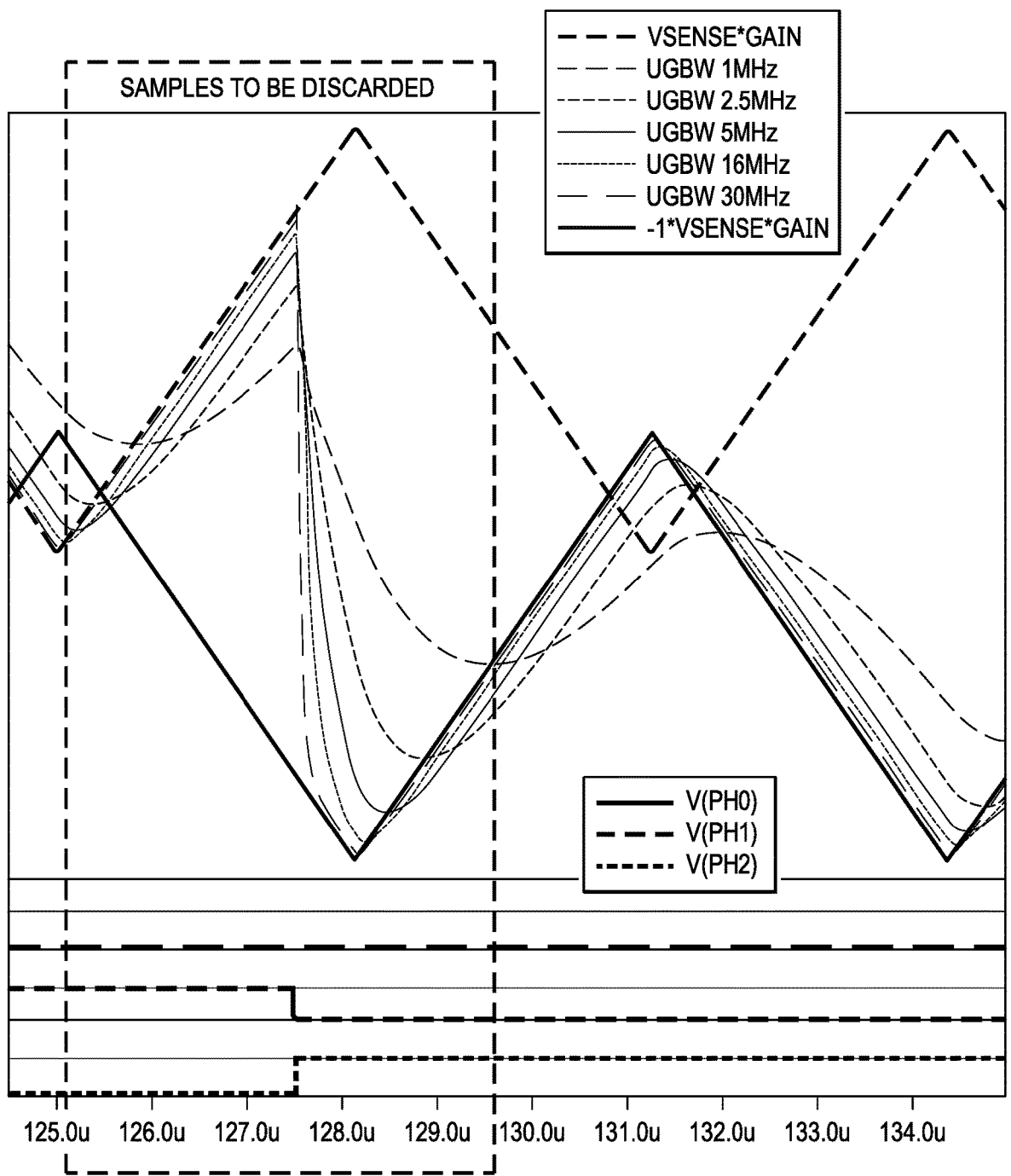
FIG. 13 is a greatly enlarged graph of the ADC output of the wireless power transmission system of FIG. 10 during transition between different operating phases.
Figure 14:
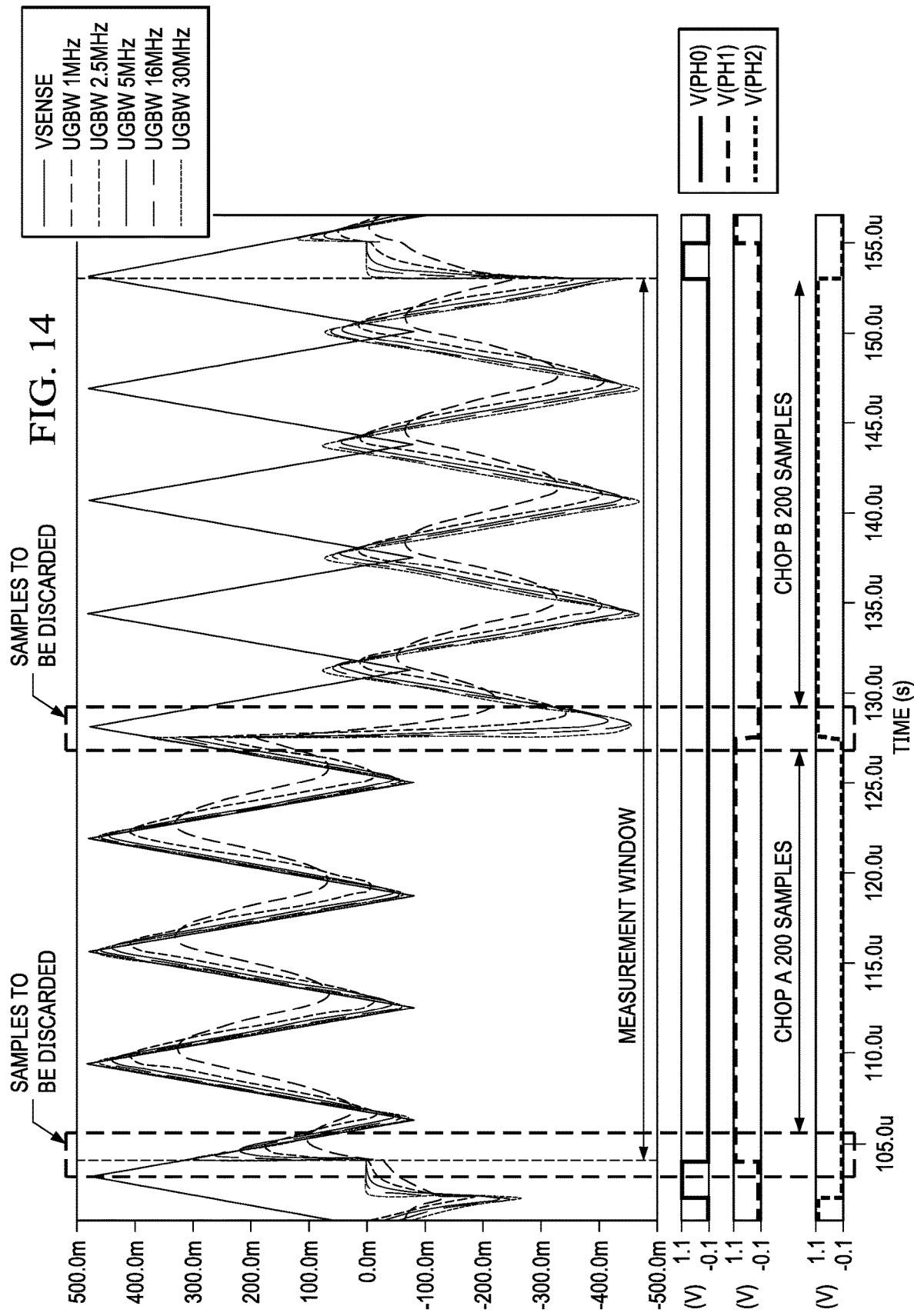
FIG. 14 is a graph of the ADC output of the wireless power transmission system of FIG. 10 during transition between different operating phases.
Figure 15:
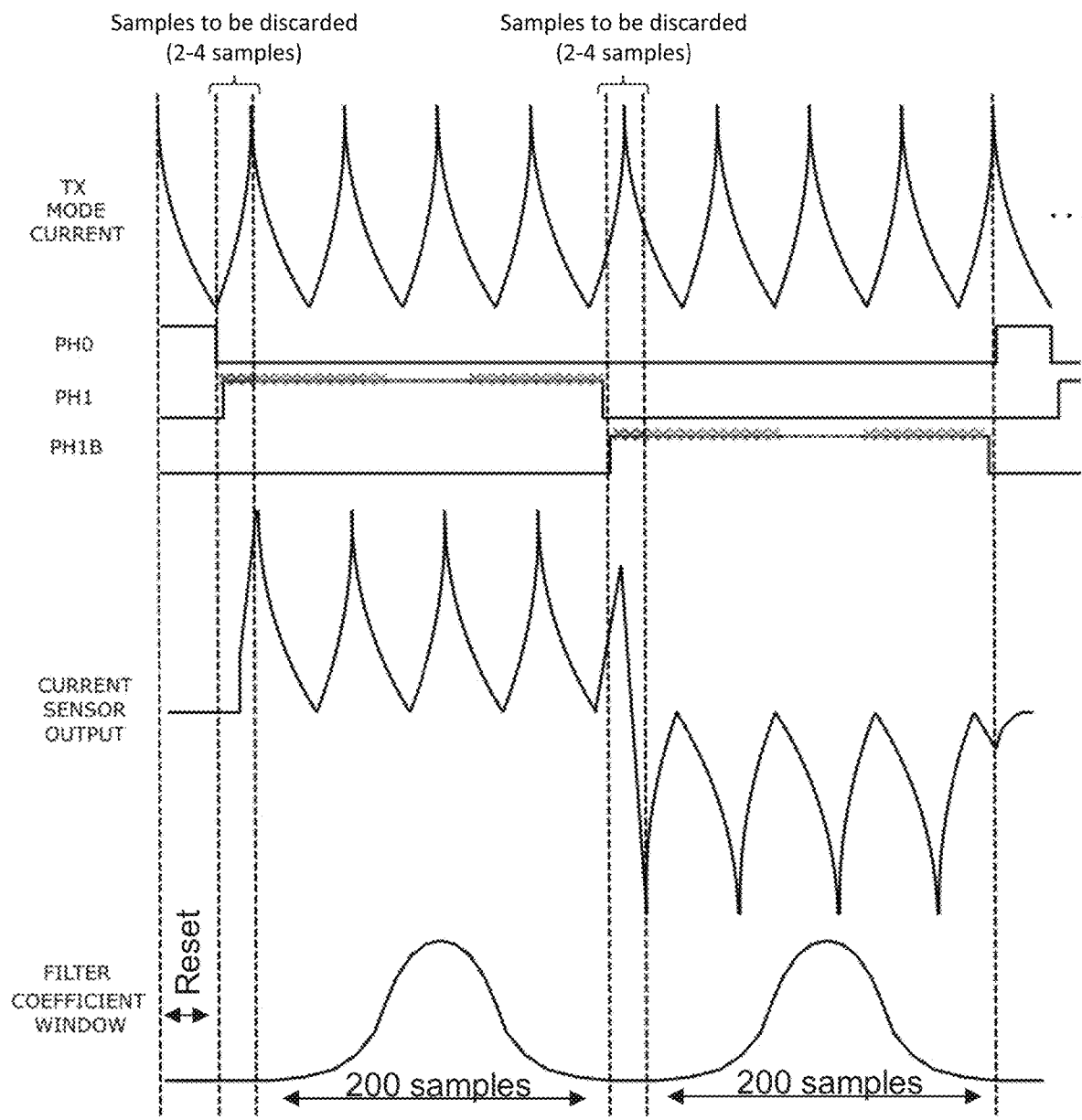
FIG. 15 is a graph of the ADC output of the wireless power transmission system of FIG. 10 during transition between different operating phases, illustrating how samples taken during the transitions are discarded.

As shown in FIG. 13, the amplification circuit 33' is unable to settle quickly enough to properly track the transition from the Reset phase to the Chop A phase, the transition from the Chop A phase to the Chop B phase, and the transition from the Chop B phase back to the Reset phase. Therefore, the digital filter 41 is set such that samples taken during these transitions are discarded, as shown in FIGS. 14 and 15.

This technique allows the rejection of offset and low-frequency noise, the use of chopping without introducing additional error (by discarding samples at the transitions described above), and the rejection of large amplitude currents generated during transmission mode.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A wireless power system, comprising:
   a bridge;
   a coil coupled between first and second inputs of the bridge;
   a tank capacitor coupled between first and second outputs of the bridge;
   a regulator;
   a sense resistor having a first terminal coupled to the first output of the bridge and a second terminal coupled to an input of the regulator;
   a switching circuit having first and second inputs respectively coupled to the first and second terminals of the sense resistor;
   a gain stage having first and second inputs capacitively coupled to first and second outputs of the switching circuit;
   an analog to digital converter (ADC) configured to digitize output of the gain stage by comparing the output of the gain stage to first and second differential reference voltages; and
   a reference voltage generator comprising a temperature independent current source coupled to source current to a reference resistor, the reference resistor having a resistance that is a multiple of a resistance of the sense resistor and that tracks the resistance of the sense resistor across temperature variation, wherein the first differential reference voltage is formed across the reference resistor;
   wherein the switching circuit is configured to, in a reset phase, short the first and second inputs of the gain stage to one another;
   wherein the gain stage is configured to, in the reset phase, short its first and second inputs to its output;
   wherein the switching circuit is configured to, in a first chopping phase, couple the first and second terminals of the sense resistor to the first and second inputs of the gain stage; and
   wherein the switching circuit is configured to, in a second chopping phase, couple the first and second terminals of the sense resistor to the second and first inputs of the gain stage.

2. The wireless power system of claim 1, further comprising processing circuitry configured to perform filtering and de-chopping on the output from the ADC.

3. The wireless power system of claim 1, wherein the switching circuit is configured to, after the reset phase, alternate between the first and second chopping phases a given number of times at a rate equal to a sampling frequency of the ADC.

4. The wireless power system of claim 1, wherein the switching circuit is configured to, after the reset phase, switch between the first and second chopping phases a given number of times at a rate less than a sampling frequency of the ADC.

5. The wireless power system of claim 4, further comprising processing circuitry configured to receive output from the ADC, to discard samples taken during transition between the reset phase and the first chopping phase, and to discard samples taken during transition between the first chopping phase and the second chopping phase.

6. The wireless power system of claim 4, wherein the switching circuit is configured to perform the reset phase between the first and second chopping phases.

7. The wireless power system of claim 1, wherein the gain stage comprises:
   a first amplifier having a first input coupled to the first output of the switching circuit by a first high voltage capacitor, a second input coupled to the second output of the switching circuit by a second high voltage capacitor, a third capacitor coupling the first input of the first amplifier to a first output of the first amplifier, a fourth capacitor coupling the second input of the first amplifier to a second output of the first amplifier, a first switch selectively coupling the first input of the first amplifier to the first output of the first amplifier, and a second switch selectively coupling the second input of the first amplifier to the second output of the first amplifier.

8. The wireless power system of claim 7, wherein the gain stage further comprises a common mode feedback circuit coupling a common mode voltage between the first and second outputs of the first amplifier.

9. The wireless power system of claim 7, further comprising an anti-aliasing filter receiving input from the first and second outputs of the first amplifier and providing output to the ADC.

10. The wireless power system of claim 7, wherein the first and second high voltage capacitors are metal-oxide-metal capacitors.

11. The wireless power system of claim 7, wherein the gain stage further comprises:
a second amplifier having a first input coupled to the first output of the first amplifier by a first low voltage capacitor, a second input coupled to the second output of the first amplifier by a second low voltage capacitor, a fifth capacitor coupling the first input of the second amplifier to a first output of the second amplifier, a sixth capacitor coupling the second input of the second amplifier to a second output of the second amplifier, a third switch selectively coupling the first input of the second amplifier to the first output of the second amplifier, and a fourth switch selectively coupling the second input of the second amplifier to the second output of the second amplifier.

12. The wireless power system of claim 11, wherein the gain stage further comprises a common mode feedback circuit coupling a common mode voltage between the first and second outputs of the first amplifier, and between the first and second outputs of the second amplifier.

13. The wireless power system of claim 11, further comprising an anti-aliasing filter receiving input from the first and second outputs of the second amplifier and providing output to the ADC.

14. The wireless power system of claim 1, wherein the switching circuit comprises:
a first switch selectively coupling the first input of the switching circuit to the first output of the switching circuit;
a second switch selectively coupling the first input of the switching circuit to the second output of the switching circuit;
a third switch selectively coupling the second input of the switching circuit to the second output of the switching circuit; and
a fourth switch selectively coupling the second input of the switching circuit to the first output of the switching circuit.

15. The wireless power system of claim 1, wherein the reference resistor is formed from a given number of resistance units spaced equally about a perimeter of the sense resistor.

16. The wireless power system of claim 1, wherein the reference resistor is purposely separated into substructures placed in a centroid manner around the sense resistor.

17. The wireless power system of claim 1, wherein the reference resistor and the sense resistor are formed by at least two different resistive materials and for which an amount of contribution of each material in respect to an overall value of the resistance is identical for both the reference resistor and the sense resistor.

18. The wireless power system of claim 1, wherein the reference resistor and the sense resistor are formed from multiple resistive materials.

19. The wireless power system of claim 18, wherein the multiple resistive material of the reference resistor and sense resistor includes part of each resistor being polysilicon and part of each resistor being metal.

20. A wireless power system, comprising:
a bridge;
a coil coupled between first and second inputs of the bridge;
a tank capacitor coupled between first and second outputs of the bridge;
a regulator;
a sense resistor having a first terminal coupled to the first output of the bridge and a second terminal coupled to an input of the regulator;
a switching circuit having first and second inputs respectively coupled to the first and second terminals of the sense resistor;
a gain stage having first and second inputs capacitively coupled to first and second outputs of the switching circuit;
an analog to digital converter (ADC) configured to digitize output of the gain stage by comparing the output of the gain stage to first and second differential reference voltages; and
a reference voltage generator comprising a temperature independent current source coupled to source current to a reference resistor, the reference resistor having a resistance that is a multiple of a resistance of the sense resistor and that tracks the resistance of the sense resistor across temperature variation, wherein the first differential reference voltage is formed across the reference resistor.

21. The wireless power system of claim 20, further comprising processing circuitry configured to perform filtering and de-chopping on the output from the ADC.

22. The wireless power system of claim 20, wherein the gain stage comprises:
a first amplifier having a first input coupled to the first output of the switching circuit by a first high voltage capacitor, a second input coupled to the second output of the switching circuit by a second high voltage capacitor, a third capacitor coupling the first input of the first amplifier to a first output of the first amplifier, a fourth capacitor coupling the second input of the first amplifier to a second output of the first amplifier, a first switch selectively coupling the first input of the first amplifier to the first output of the first amplifier, and a second switch selectively coupling the second input of the first amplifier to the second output of the first amplifier.

23. The wireless power system of claim 22, wherein the gain stage further comprises a common mode feedback circuit coupling a common mode voltage between the first and second outputs of the first amplifier.

24. The wireless power system of claim 22, further comprising an anti-aliasing filter receiving input from the first and second outputs of the first amplifier and providing output to the ADC.

25. The wireless power system of claim 22, wherein the first and second high voltage capacitors are metal-oxide-metal capacitors.

26. The wireless power system of claim 22, wherein the gain stage further comprises:

a second amplifier having a first input coupled to the first output of the first amplifier by a first low voltage capacitor, a second input coupled to the second output of the first amplifier by a second low voltage capacitor, a fifth capacitor coupling the first input of the second amplifier to a first output of the second amplifier, a sixth capacitor coupling the second input of the second amplifier to a second output of the second amplifier, a third switch selectively coupling the first input of the second amplifier to the first output of the second amplifier, and a fourth switch selectively coupling the second input of the second amplifier to the second output of the second amplifier.

27. The wireless power system of claim 26, wherein the gain stage further comprises a common mode feedback circuit coupling a common mode voltage between the first and second outputs of the first amplifier, and between the first and second outputs of the second amplifier.

28. The wireless power system of claim 26, further comprising an anti-aliasing filter receiving input from the first and second outputs of the second amplifier and providing output to the ADC.

\* \* \* \* \*

UNITED STATES PATENT AND TRADEMARK OFFICE
CERTIFICATE OF CORRECTION

PATENT NO. : 11,175,319 B1
APPLICATION NO. : 17/025210
DATED : November 16, 2021
INVENTOR(S) : Yannick Guedon et al.

Page 1 of 1

It is certified that error appears in the above-identified patent and that said Letters Patent is hereby corrected as shown below:

In the Specification

At Column 9, Line 6, please replace the term [[ PHIL ]] with -- PHI1 --.

Signed and Sealed this
Twenty-seventh Day of August, 2024

Katherine Kelly Vidal
*Director of the United States Patent and Trademark Office*